(12) United States Patent
Koeth et al.

(10) Patent No.: US 8,855,156 B2
(45) Date of Patent: Oct. 7, 2014

(54) DFB LASER DIODE HAVING A LATERAL COUPLING FOR LARGE OUTPUT POWER

(75) Inventors: Johannes Bernhard Koeth, Gerbrunn (DE); Wolfgang Zeller, Wuerzburg (DE)

(73) Assignee: nanoplus GmbH Nanosystems and Technologies, Gerbrunn (DE)

( * ) Notice: Subject to any disclaimer, the term of this patent is extended or adjusted under 35 U.S.C. 154(b) by 333 days.

(21) Appl. No.: 13/266,831

(22) PCT Filed: May 5, 2010

(86) PCT No.: PCT/EP2010/056096
§ 371 (c)(1),
(2), (4) Date: Dec. 27, 2011

(87) PCT Pub. No.: WO2010/128077
PCT Pub. Date: Nov. 11, 2010

(65) Prior Publication Data
US 2012/0093187 A1    Apr. 19, 2012

(30) Foreign Application Priority Data

May 5, 2009    (DE) .......................... 10 2009 019 996

(51) Int. Cl.
*H01S 5/00* (2006.01)
*H01S 5/12* (2006.01)
*H01S 5/10* (2006.01)
*H01S 5/22* (2006.01)
*H01S 5/20* (2006.01)

(52) U.S. Cl.
CPC ............. *H01S 5/1228* (2013.01); *H01S 5/1014* (2013.01); *H01S 5/1203* (2013.01); *H01S 5/1237* (2013.01); *H01S 5/22* (2013.01); *H01S 5/2004* (2013.01)

USPC ....................................................... 372/45.01

(58) Field of Classification Search
USPC ............................................................ 385/14
See application file for complete search history.

(56) References Cited

U.S. PATENT DOCUMENTS

| 4,328,469 A | 5/1982 | Scifres et al. |
| 5,982,804 A | 11/1999 | Chen et al. |

(Continued)

FOREIGN PATENT DOCUMENTS

| EP | 0984535 | 3/2000 |
| JP | 10-098235 | 4/1998 |

(Continued)

OTHER PUBLICATIONS

International Search Report in Application No. PCT/EP2010/056096 dated Jul. 8, 2010, 4 pages.

(Continued)

*Primary Examiner* — Tuan Nguyen
(74) *Attorney, Agent, or Firm* — Meyertons Hood Kivlin Kowert & Goetzel, P.C.; Jeffrey C. Hood

(57) ABSTRACT

The invention relates to a DFB laser diode having a lateral coupling, which comprises at least one semi-conductor substrate (10), at least one active layer (40) that is arranged on the semiconductor substrate, at least one ridge (70) that is arranged above the active layer (40), at least one periodic surface structure (110) that is arranged next to the ridge (70) above the active layer (40) and at least one wave guide layer (30, 50) comprising a thickness ≥1 µm that is arranged below and/or above the active layer.

27 Claims, 16 Drawing Sheets

(56) References Cited

U.S. PATENT DOCUMENTS

| | | |
|---|---|---|
| 6,301,283 B1 | 10/2001 | Chen et al. |
| 2002/0031297 A1* | 3/2002 | Forrest et al. .................. 385/28 |
| 2002/0141682 A1 | 10/2002 | Ryu et al. |
| 2003/0007719 A1* | 1/2003 | Forrest et al. .................. 385/14 |
| 2003/0007766 A1 | 1/2003 | Galarza et al. |
| 2004/0017836 A1 | 1/2004 | Buda et al. |
| 2004/0072379 A1 | 4/2004 | Forchel et al. |
| 2005/0185889 A1* | 8/2005 | Xia et al. ........................ 385/43 |
| 2007/0002914 A1* | 1/2007 | Ryu et al. .................. 372/45.01 |
| 2008/0144691 A1 | 6/2008 | Hatori et al. |

FOREIGN PATENT DOCUMENTS

| | | |
|---|---|---|
| JP | 10144991 | 5/1998 |
| JP | 11-214793 | 8/1999 |
| JP | 2001-024275 | 1/2001 |
| JP | 2001024275 | 1/2001 |
| JP | 2007-184511 | 7/2007 |

OTHER PUBLICATIONS

Fiebig, et al., "High-Power DBR-Tapered laser at 980 nm for Single-Path Second Harmonic Generation," IEEE Journals of Selected Topics in Quantum Electronics, vol. 15, No. 3, May 2009, pp. 978-982.

Wenzel, et al., "Fundamental-Lateral Mode Stabilized High-Power Ridge-Waveguide Lasers With a Low Beam Divergence," IEEE Photonics Technology Leiters, vol. 20, No. 3, Feb. 1, 2008, pp. 214-216.

Ryvkin, et al., "Asymmetric, nonbroadened large optical cavity waveguide structures for high-power long-wavelength semiconductor lasers," Journal of Applied Physics, 97.123103, 2005, 6 pages.

Viheriala, et al., "Surface-grating-based distributed feedback lasers fabricated using nanoimprint lithography," Semiconductor Conference, 2008, pp. 95-98.

Wolfgang Zeller, et al., "High power pulsed 976 nm DFB laser diodes," Proceedings of the SPIE, vol. 7682, Apr. 28, 2010, XP002587963, 10 pages.

* cited by examiner

DFB LASER DIODE HAVING A LATERAL COUPLING FOR LARGE OUTPUT POWER

1. TECHNICAL FIELD

The present invention relates to a DFB laser diode having a lateral coupling for large output power.

2. PRIOR ART

Laser diodes can be used as coherent light sources and play an important part in many economic areas. As an example two areas of application are illustrated: The use for data transmission in telecommunications and as analysis tool in the field of sensor technology. In these as well as in most other areas of application it is very important that the radiation emitted by the laser diode essentially corresponds to a single natural mode of the laser cavity and that the bandwidth of this single natural mode is small.

Semiconductor lasers usually emit light of several natural modes which is due to their broad amplification spectrum. In order to ensure that the emitted laser radiation essentially comprises light of a single natural mode, the concept of distributed feedback (DFB) of the laser light between both mirrors of the laser cavity has been proposed some time ago. In order to build such DFB laser diodes, the epitaxial process that is used for applying the stack of layers of the laser diode to the semiconductor substrate is interrupted and a periodic change of the refractive index and/or of the absorption of the emitted radiation is introduced into the active layer itself or in the layers above or below. Thereby, the threshold amplification of a natural mode of the cavity is reduced and/or the threshold amplification of all other natural modes within the amplification spectrum is increased such that the semiconductor laser only emits light of one natural mode (and thus of one wavelength). In a second epitaxial step the remaining layers are then deposited. This interruption of the layer growth, however, has some problems: On the one hand, this production process is complex and on the other hand, the quality of the layers that form the laser diode may be compromised by the structuring process and the second epitaxial process due to the introduction of crystal defects. This may have negative effects on the efficiency and in particular on the lifetime of the DFB laser diodes.

The concept of lateral coupling of DFB laser diodes that has been introduced several years ago and that is described in the patent publication EP 0 984 535 B1 overcomes the mentioned disadvantages of the above described common DFB laser. In the following, the lateral direction refers to the direction that is parallel to the layer stack and perpendicular to the propagation of the light. The direction perpendicular to the layer stack and perpendicular to the propagation of the light is referred to as transverse direction. In the following, the longitudinal direction identifies the direction of propagation of the laser radiation within the laser cavity.

DFB laser diodes having a lateral coupling are produced in a single epitaxial process. It is an important advantage of the concept of lateral DFB coupling that, after the production of the structure of the laser, its emission spectrum can be measured and that based on these measurements the desired wavelength of emission may be exactly adjusted via the period of the surface structure.

Due to the production of DFB laser diodes having a lateral coupling in a single epitaxial process, the crystal quality of the stack of layers that forms the laser diode cannot be influenced by interrupting the growth of the layer, the structuring process and the second epitaxial process. In connection with the precisely adjustable emission wavelength this results in a large yield in the production process.

DFB laser diodes having a lateral coupling are preferably used as single mode light sources for small or medium output power. Due to their distributed feedback mechanism, DFB laser diodes usually comprise rather low output power. However, some applications require the allocation of large light output which cannot be provided by DFB laser diodes having a lateral coupling that have been produced according to prior art.

For laser diodes that are constructed for large output power, the highest optical power density usually occurs at the mirror(s) of the laser cavity. Degradation processes of laser mirrors by building an oxide layer have been known for a while; these processes are amplified by the presence of a very high photon density. These degradation processes result in a sudden destruction of the laser mirror due to a local melting of the semiconductor material. This process is referred to as catastrophic optical damage or COD. Therefore, it is an essential factor that limits the light output that can be coupled out from the laser cavity, the optical power density that can occur at a laser mirror and that does not result in an accelerated aging process of the laser diode by the degradation of its laser mirrors.

One possibility to reduce the rate of the degradation process is the application of a coating with a dielectric material to the laser mirror. This coating process is described by M. Fukuda in "Semiconductor Lasers and LEDs" on pages 134-136.

The U.S. Pat. No. 4,328,469 discloses a hetero structure injection laser diode having an active layer sandwiched by a pair of intermediate index layers. The US 2003/0007766 A1 discloses a wave guide component wherein their wave guide is tapered into the direction of a front side. The US 2004/0017836 A1 discloses a single mode optical device with an absorbing layer and an isolation layer in order to attenuate higher order lateral optical modes. The US 2008/0144691 A1 discloses an optical semiconductor device wherein a diffraction grating is disposed on both sides of a wave guide. The US 2002/0141582 A1 discloses a spot converter that is integrated in an optical device.

It is therefore the technical problem underlying the present invention to provide techniques that allow for coupling out of large light output of DFB laser diodes having a lateral coupling such that the above described degradation processes can be avoided and such that other characteristics of the laser diodes are not significantly deteriorated.

The U.S. Pat. No. 5,982,804 discloses a method for manufacturing a laterally coupled DFB semiconductor laser comprising an upper and a lower wave guide layer. Further, the semiconductor laser has an upper and a lower cladding layer. Before applying the photo layer, a protective layer is formed on the contacting layer of the ridge. Thereby, it can be avoided that during etching of the grating, a grating is also etched onto the ridge which would result in a bad electrical contact.

The JP 2001 024 275 discloses a manufacturing process for a laterally coupled DFB quantum well laser. The quantum well laser comprises an asymmetrical wave guide structure wherein the lower n-doped wave guide layer has a thickness of 100 nm and the upper p-doped wave guide layer has a thickness of 10 nm. The laterally arranged grid structure is a diffraction grating made of an isolating material. One laser facet has an antireflective coating with a reflectivity of up to 1% and the second laser facet comprises a reflection layer with a reflectivity of 90%.

The Article "High-Power DBR-Tapered Laser at 980 nm for Single-Path Second Harmonic Generation" by C. Fiebig et al., IEEE J. of Selected Topics in Quantum Electronics, vol. 15, no. 3, May/June 2009, p. 978-983 comprises experimental results of edge-emitting DBR-tapered diode lasers that emit at 980 nm. The output power of the investigated lasers is up to 12 W with a conversion efficiency of about 45%. The lasers also exhibit a small vertical divergence <15° full width at half maximum (FWHM), a nearly diffraction limited beam quality and a narrow spectral line width with FWHM smaller than 12 µm.

The US 2007/0002914 A1 discloses a semiconductor laser diode with n-doped lower cladding layer, a n-doped lower optical wave guide layer, an active layer, a p-doped upper optical wave guide layer and a p-doped upper cladding layer that are formed on a substrate. The thickness of the n-doped lower optical wave guide layer is larger than that of the p-doped upper wave guide layer.

The Article "Fundamental-Lateral Mode Stabilized High-Power-Ridge Waveguide Lasers With a Low Beam Divergence" by H. Wenzel et al., IEEE Phot. Techn. Lett., Vol. 20, No. 3, Feb. 1, 2008, p. 214-216 compares ridge-wave guide lasers with trench widths of 5 and 20 µm. The emission wavelength is around 1064 nm and the ridge width is 5 µm. The maximum output power exceeds 2 W. The full width at half maximum of the vertical far field profile is only 15° due to a super large optical cavity.

The article "Asymmetric, nonbroadened large optical cavity wave guide structures for high-power long-wavelength semiconductor lasers" by B. S. Ryvkin and E. A. Avrutin in J. of Appl. Phys. 97, (2005) p. 123103-1 to 123103-6 presents a simple semi-analytical model for evaluating the free-carrier loss which proves that these losses may become important at large bias currents. It is shown that non-broadened asymmetric wave guide structures can significantly reduce these losses with little or no degradation in threshold, near- and far field properties.

The U.S. Pat. No. 6,301,283 B1 discloses a DFB laser that comprises: a semiconductor substrate, an active layer formed on the top surface of the semiconductor substrate, a ridge strip formed on the active layer, a periodic structure that extends along the ridge strip and wherein the ridge strip comprises at least two different widths.

The US 2003/000719 A1 discloses a photonic integrated circuit that comprises a first wave guide with a first mode of light propagating therein and a second wave guide with a second mode of light propagating therein. The first and second modes of light have different effective refractive indices. A taper formed in the second wave guide facilitates communication of light between the wave guides.

The article "Surface-grating-based distributed feedback lasers fabricated using nanoimprint lithography" by J. Viheriiälä et al., Semiconductor Conf. 2008, CAS 2008, Intern., IEEE, Piscataway, N.J., USA reports about the manufacturing of DFB lasers using a third order grating that has been produced by a laterally-corrugated ridge. The lasers have a side mode suppression ratio of more than 50 dB.

3. SUMMARY OF THE INVENTION

According to one embodiment of the present invention this problem is solved by an apparatus according to claim 1. In one embodiment the apparatus comprises a DFB laser diode having a lateral coupling that comprises at least one semiconductor substrate, at least one active layer that is arranged on the semiconductor substrate, at least one ridge that is arranged above the active layer, at least one periodic surface structure that is arranged above the active layer, and at least one wave guide layer with a thickness ≥1 µm that is arranged below and/or above the active layer.

Due to the thick wave guide layer, the spatial distribution of the optical intensity in this layer and therefore perpendicular to the stack of layers can extend over a larger distance. This broadening of the laser radiation in a transverse direction results in a reduction of the maximum of the optical intensity by having equal optical power within the laser mode. Thus, by having the same optical power of the laser mode, the maximum optical power density on the laser mirror and thus also its load is reduced. Thus, for a given maximum load of the laser mirror, the light output that can be coupled out from the laser cavity can be increased. Moreover, the broader distribution of the radiation of the laser mode in direction of the stack of layers of the laser cavity leads to a reduced transverse divergence angle of the laser light after emission of the laser cavity. Due to this reduced beam divergence in transverse direction which is similar to the divergence angle in lateral direction, a simpler yet more efficient coupling of the laser radiation into optical elements is achieved.

The periodic surface structure arranged above the active layer can be arranged across the full length of the active layer in longitudinal direction. However, it is also possible that the periodic surface structure extends only partially across the area of the active layer. Moreover, it is possible that the periodic surface structure and the active layer in longitudinal direction are arranged completely separate from each other.

In a preferred embodiment of a DFB laser diode having a lateral coupling according to the invention, the wave guide layer comprises a thickness in the range of 1.0 µm to 5.0 µm, preferably of 1.5 µm to 3.0 µm and particularly preferred of 2.0 µm to 2.5 µm. However, it is also possible to extend the thickness of the wave guide layer downwards and upwards depending on the thickness of the active layer and the semiconductor material system that is used for the manufacturing of laser diodes for different wavelengths. It has been found that the specified layer thickness is optimal for DFB laser diodes having a lateral coupling that emit light in a wavelength range of 900 nm to 1000 nm. At a constant refractive index of the active layer and the wave guide layer, the thickness of the wave guide layers scales linearly according to the wavelength of the laser light.

According to a further aspect of the present invention the underlying technical problem is solved by an apparatus according to claim 3. In one embodiment the apparatus comprises a DFB laser diode having a lateral coupling that comprises at least one semiconductor substrate, at least one active layer that is arranged on the semiconductor substrate, at least one ridge that is arranged above the active layer, at least one periodic surface structure that is arranged next to the ridge above the active layer, and at least one wave guide layer arranged below and above the active layer, wherein the layer thickness of the respective wave guide layers is different.

For DFB laser diodes having a lateral coupling, a thick wave guide layer above the active layer essentially leads to coupling out of the emitted laser radiation by reducing the spatial overlapping with the periodic surface structure. Thereby, the effect of the distributed feedback and thus the suppression of further natural modes of the laser cavity within the amplification bandwidth can be clearly reduced. Due to the combination of a thin wave guide layer above and a thick wave guide layer below the active layer, a reduction of the coupling factor of the periodic surface structure can widely be avoided. At the same time the propagation of the optical intensity in transverse direction is increased due to this layer combination as compared to conventional layer design according to prior art. This leads to a smaller far field angle in transverse direction. This leads to a higher degree of efficiency when the laser radiation is coupled into rotation-symmetric lenses, which results in an increased amount of available or useable optical power by having the same light output emitted by the laser diode.

According to a particularly preferred embodiment the wave guide layer that is arranged below the active layer comprises a layer thickness ≥1 μm and the wave guide layer that is arranged above the active layer comprises a thickness of ≤1 μm. These parameters are optimal for laser diodes that emit light in the wavelength range from 900 nm to 1000 nm. By maintaining constant refractive indices for the active layer and the wave guide layers, the thickness of the thick wave guide layer (layer thickness ≥1 μm) varies linearly with the wavelength of the laser radiation.

According to a particularly preferred embodiment the lower wave guide layer comprises a thickness in the range from 1.0 μm to 5.0 μm, preferably from 1.5 μm to 3.0 μm and particularly preferred from 2.0 μm to 2.5 μm and the upper wave guide layer comprises a thickness in the range from 10 nm to 500 nm, preferably from 15 nm to 100 nm and particularly preferred from 20 nm to 50 nm.

According to a further preferred embodiment the difference of the refractive indices between the active layer and the wave guide layer is in a range from 0.04 to 0.40, preferably from 0.06 to 0.30 and particularly preferred from 0.08 to 0.25. This difference of the refractive indices is again optimized for a wavelength range of the laser light from 900 nm to 1000 nm. For larger wavelengths, increasing of geometrical parameters such as layer thicknesses, widths of the ridge and lattice periods may be necessary.

According to a further aspect of the present invention the underlying technical problem is solved according to an apparatus according to claim 9. In one embodiment the apparatus comprises a DFB laser diode having a lateral coupling that comprises at least one semiconductor substrate, at least one active layer that is arranged on the semiconductor substrate, at least one ridge that is arranged above the active layer, at least one periodic surface structure that is arranged next to the ridge above the active layer and wherein the cross section of the ridge, preferably its width, is tapered into the direction of at least one laser mirror.

By tapering the ridge into the direction of one laser mirror, the intensity distribution of the laser mode is shifted downwards into the direction of the lower wave guide layer. In particular for a thick lower wave guide layer this leads at the same time to a broadening of the optical intensity distribution at the laser mirror within the lower wave guide layer. Linked thereto is a reduction of the maximum intensity density at the laser mirror which again may be used for increasing the light output that can be coupled out from the laser cavity using the laser mirror. Moreover, the broadening of the transverse intensity distribution that is caused by the tapering results in a reduction of the divergence angle of the light output that is emitted from the laser cavity into transverse direction. Thereby, it can be achieved that the transverse and lateral divergence angle are nearly equal to each other. Thus, by tapering the ridge the coupling of laser radiation in a simple yet efficient manner becomes possible.

Besides the reduction of the width of the ridge, by the reduction of the height of the ridge the optical intensity distribution can also be shifted into the direction of the lower wave guide layer. Moreover, the tapering of the ridge and the reduction of its height into the direction of at least one laser mirror may be combined.

A very particularly preferred embodiment comprises at least one wave guide layer that is arranged below and above the active layer, wherein the thickness of both wave guide layers is different and wherein the cross section of the ridge, preferably its width, is tapered into the direction of at least one laser mirror.

In a preferred embodiment, the width of the ridge is tapered linearly in the direction of at least one laser mirror. In another preferred embodiment, the width of the ridge is tapered exponentially in the direction of at least one laser mirror.

In a further preferred embodiment, the width of the ridge is in the range from 0.5 μm to 10 μm, preferably from 1.0 μm to 7.0 μm and particularly preferred from 2.0 μm to 4.0 μm. In another preferred embodiment, the width of the ridge on at least one laser mirror is in the range from 0 nm to 1000 nm, preferably from 100 nm to 700 nm and particularly preferred from 200 nm to 500 nm.

In a particularly preferred embodiment, the tapering of the width of the ridge in the direction of at least one laser mirror occurs over a length in the range from 50 μm to 1000 μm, preferably from 100 μm to 600 μm and particularly preferred from 200 μm to 400 μm.

In a particularly preferred embodiment, the width of the ridge is tapered in the direction of both laser mirrors.

According to a further aspect of the present invention, the underlying technical problem is solved by an apparatus according to claim 18. In one embodiment, the apparatus comprises a DFB laser diode having a lateral coupling that comprises at least one semiconductor substrate, at least one active layer that is arranged on the semiconductor substrate, at least one ridge that is arranged above the active layer, at least one periodic surface structure that is arranged next to the ridge above the active layer and a layer that is arranged within the ridge and which has a refractive index larger than the refractive index of the ridge.

An additional layer with a large refractive index and that is embedded within the ridge results in a deformation of the optical intensity distribution within this layer and into the direction of this layer. The modified transverse intensity distribution changes the coupling strength of the laser mode on the periodic surface structure that is arranged on the upper wave guide layer. Thereby, it is possible to compensate—at least partially—a reduced coupling constant between the laser mode and the periodic surface structure that is caused by the broadened upper wave guide layer. The layer embedded within the ridge has a large refractive index and thus provides a further degree of freedom in order to reduce the maximum intensity density on the laser mirror without significantly reducing the quality of other parameters of the laser.

A particularly preferred embodiment comprises the layer that is arranged within the ridge and whose refractive index is larger than the refractive index of the ridge and further comprises at least one wave guide layer below and above the active layer wherein the thickness of the layers of both wave guide layers is different.

A further particularly preferred embodiment comprises the layer that is arranged within the ridge and whose refractive index is larger than the refractive index of the ridge and the cross section of the ridge, preferably its width, is tapered in the direction of at least one laser mirror.

A very particularly preferred embodiment comprises the layer that is arranged within the ridge whose refractive index is larger than the refractive index of the ridge and further comprises at least one wave guide layer that is arranged below and above the active layer wherein the thickness of both wave guide layers is different and the cross section of the wave guide, preferably its width, is tapered into the direction of at least one laser mirror.

In a particularly preferred embodiment, the layer that has a high refractive index is arranged above the periodic grating structure.

In a preferred embodiment, the difference of the refractive indices between the layer having a high refractive index and the ridge is in the range from 0.10 to 0.40, preferably from 0.15 to 0.35 and particularly preferred from 0.20 to 0.30. This difference of refractive indices is particularly advantageous for DFB laser diodes with lateral coupling whose emission wave lengths are in the range from 900 nm to 1000 nm. For other material systems that are used to manufacture semiconductor lasers which emit light at different wave length ranges, this difference of the refractive indices may change.

Further embodiments of the apparatuses according to the present invention are defined in the dependent claims.

4. DESCRIPTION OF THE FIGURES

In the following detailed description, presently preferred embodiments of the invention are described with reference to the figures, wherein:

FIG. 1 presents a schematic drawing of the most important layers of a DFB laser diode which comprises a periodic surface structure for a lateral coupling to the radiation created in the laser cavity;

Figure 9:
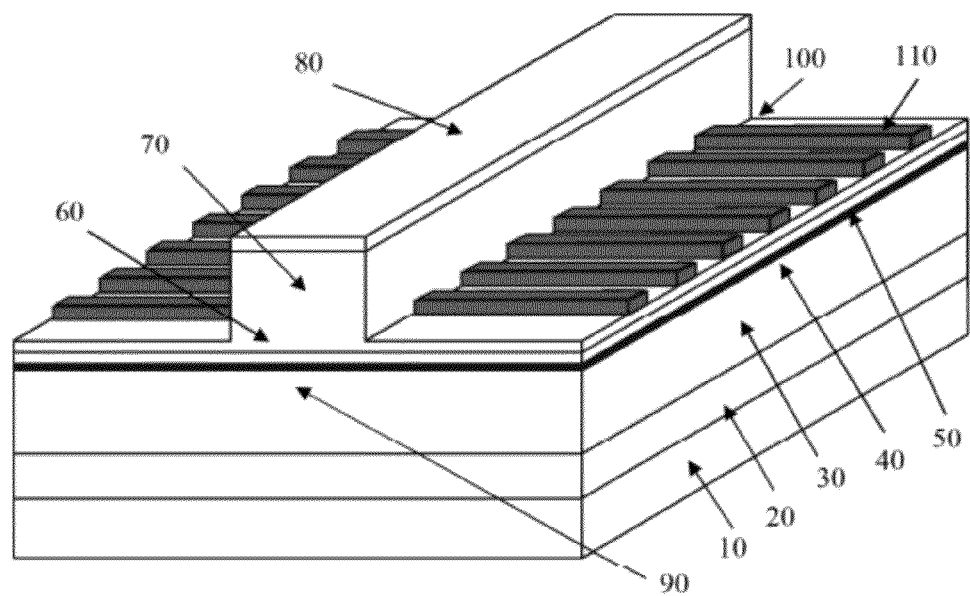
FIG. 9 shows a schematic drawing of the most important layers of a DFB laser structure having a lateral coupling wherein the lower wave guide layer comprises a considerably larger thickness than the upper wave guide layer and which therefore forms an asymmetrical LOC.
Figure 13:
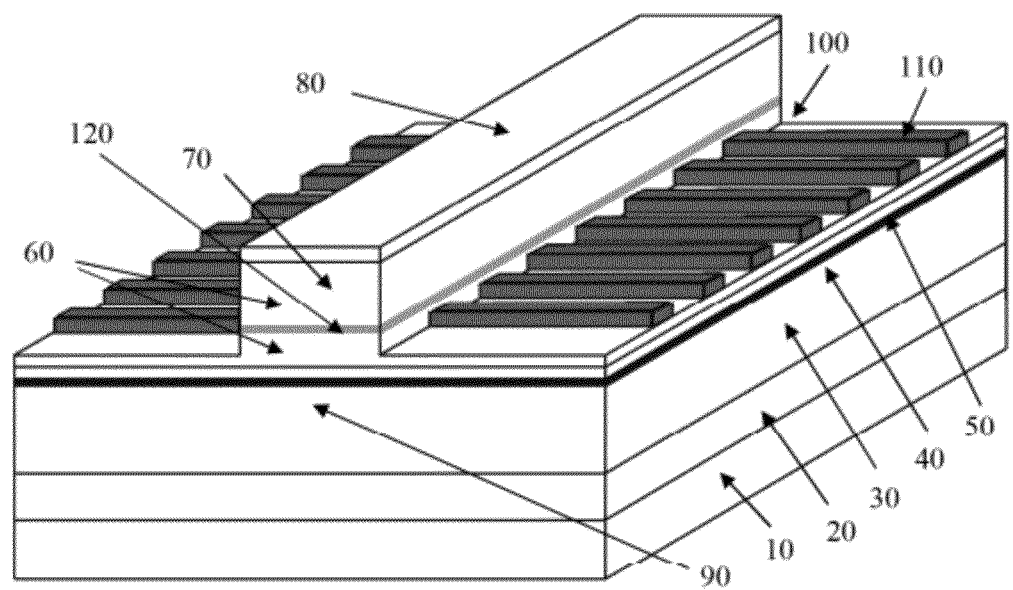
Figure 14:
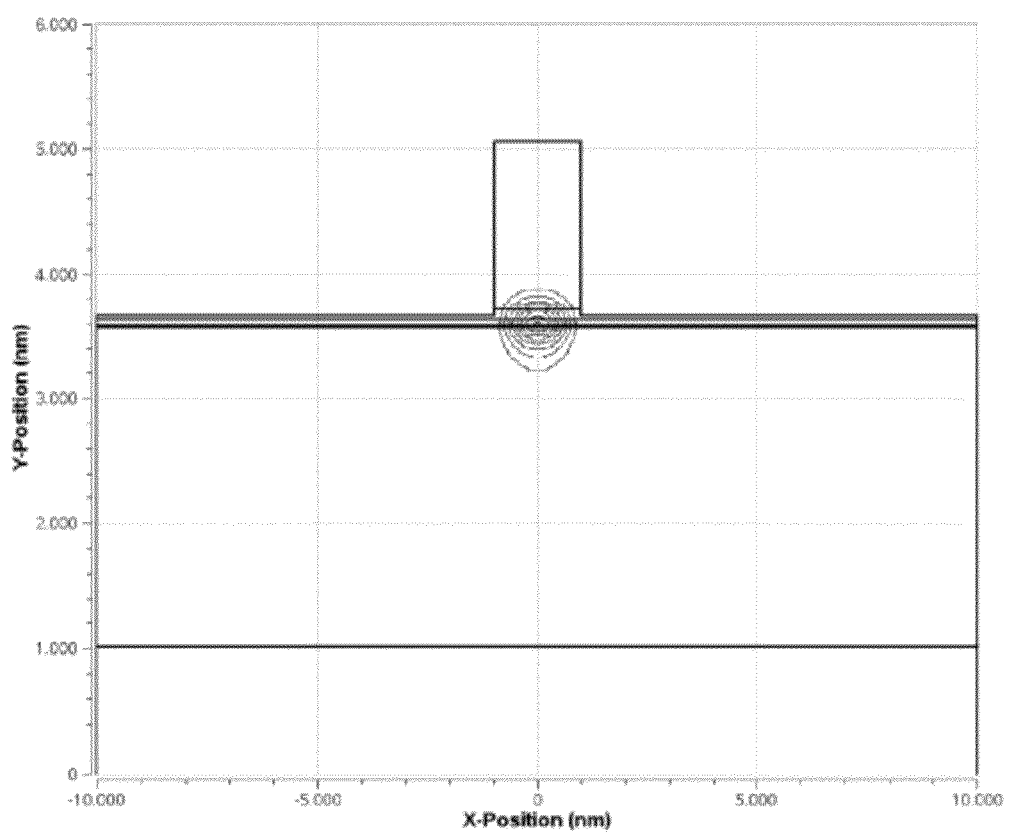
Figure 15:
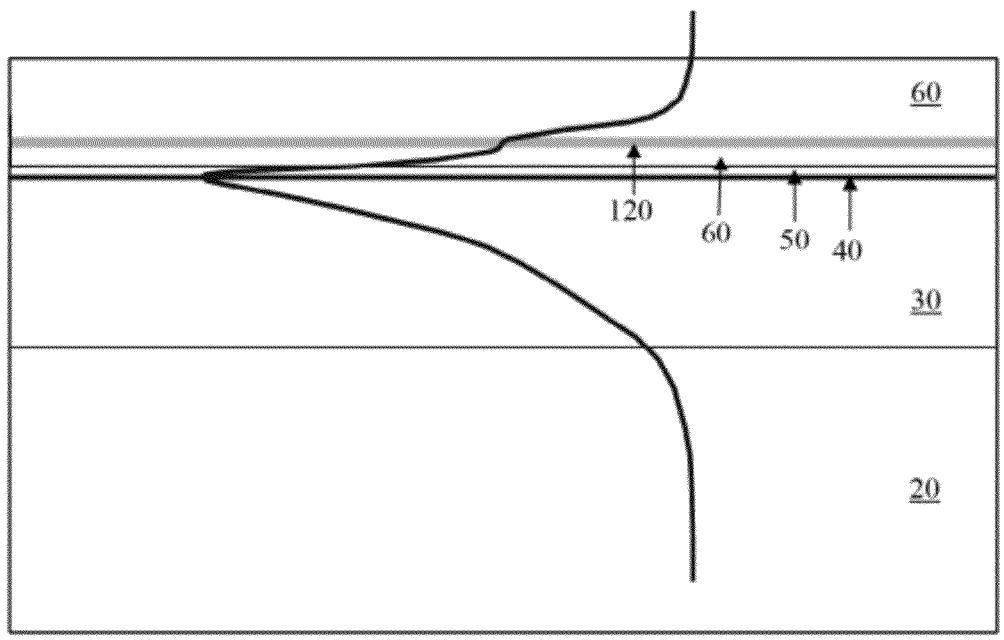
Figure 16:
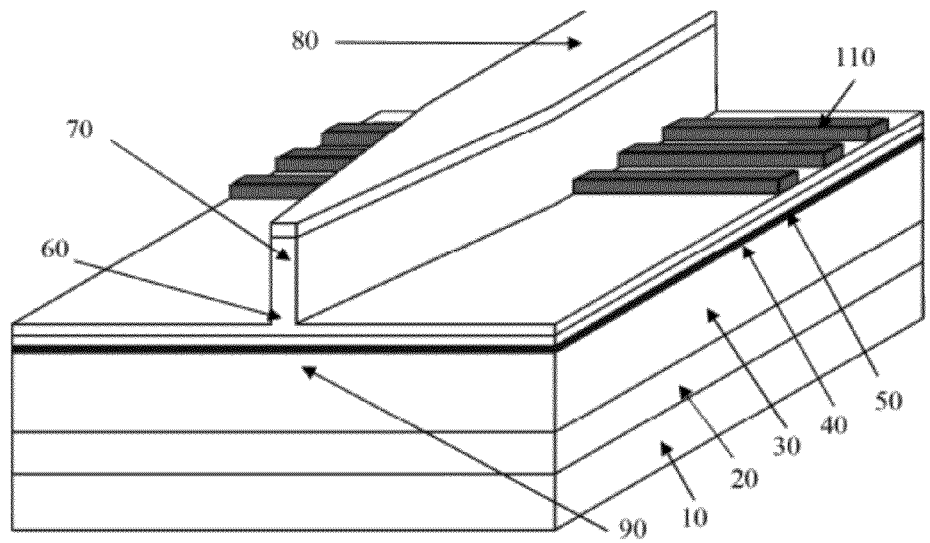
Figure 17:
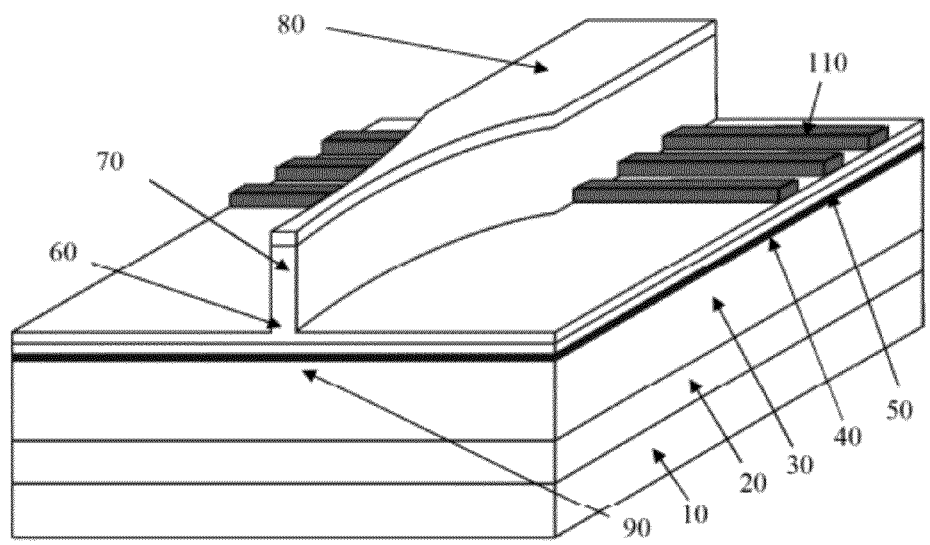
Figure 18:
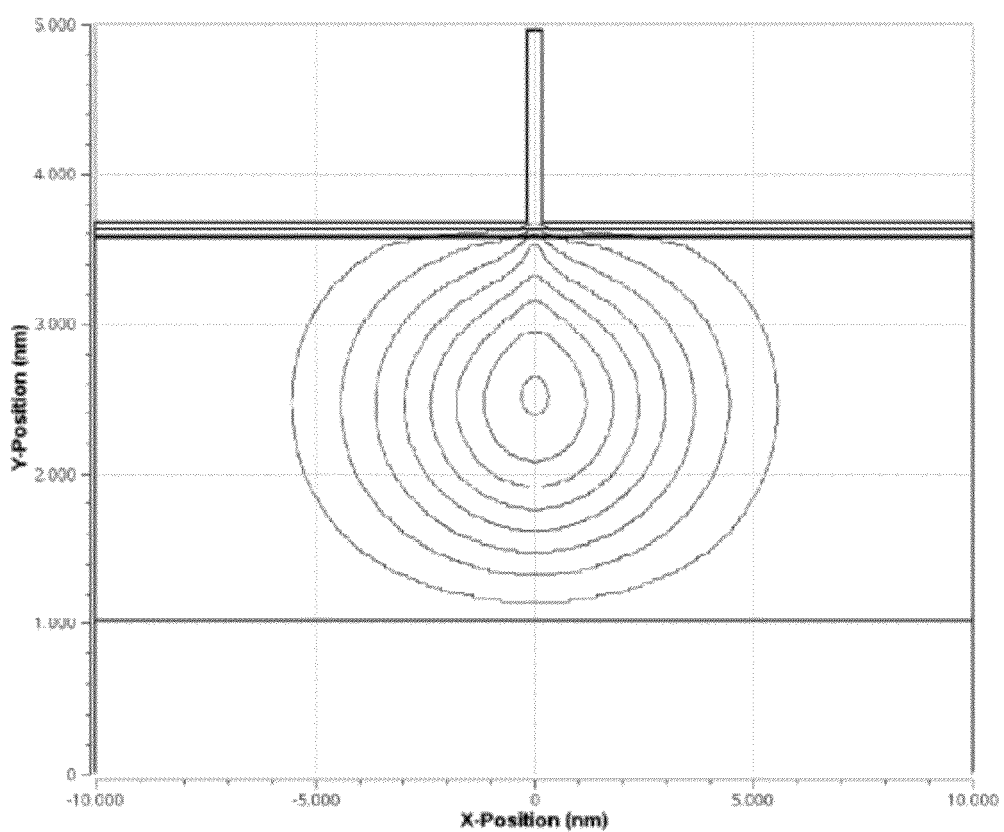
Figure 19:
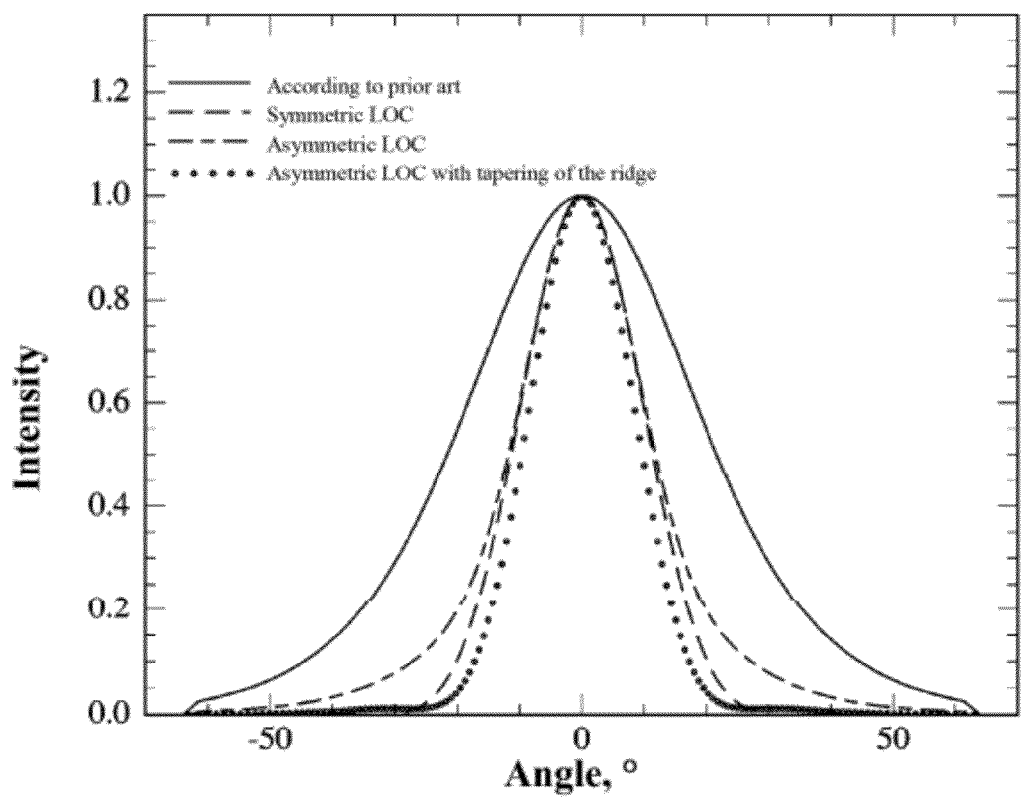
Figure 20:
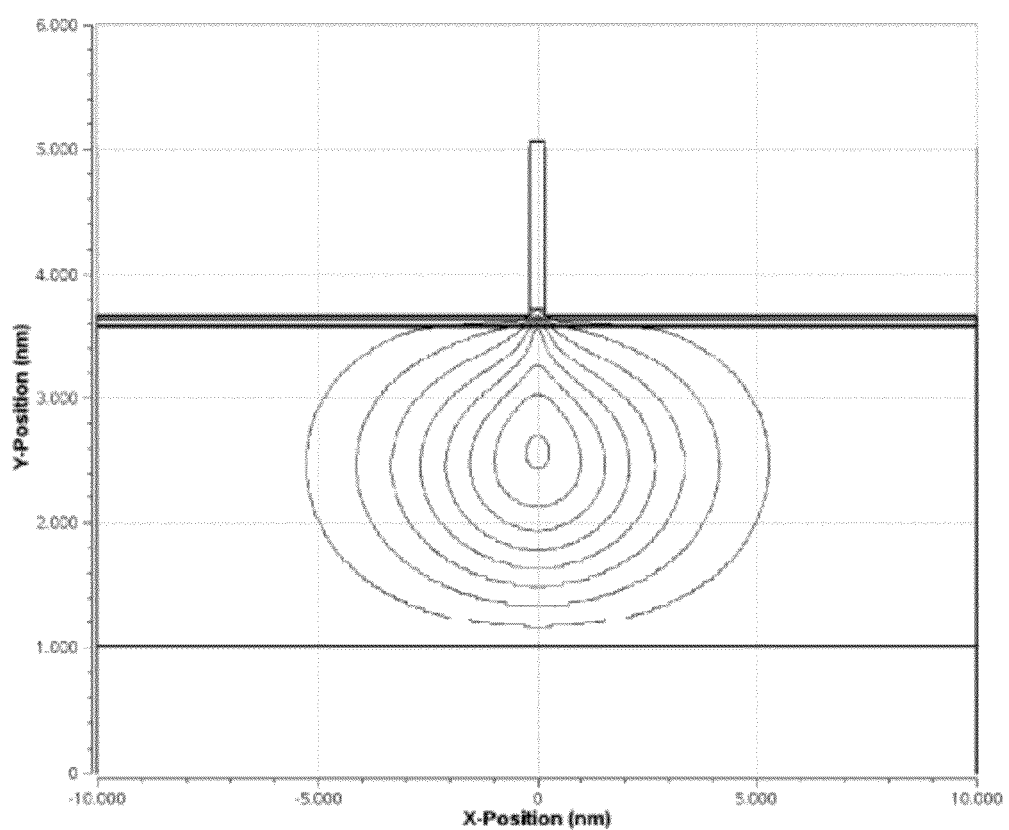

FIG. 13 presents the schematic representation of FIG. 9, wherein an additional layer with large refractive index has been embedded within the ridge above the periodic grating structure;

FIG. 14 shows a simulated two-dimensional optical intensity distribution in normalized representation in the plane of one laser mirror for the DFB laser diode having a lateral coupling according to FIG. 13;

FIG. 15 shows a vertical cut of the simulated optical intensity distribution of FIG. 14 at the maximum of the photon density distribution;

FIG. 16 shows the schematic drawing of a part of FIG. 9, wherein additionally the ridge comprises a linear tapering into the direction of a laser mirror;

FIG. 17 shows the schematic drawing of a part of FIG. 9, wherein additionally the ridge comprises an exponential tapering into the direction of a laser mirror;

FIG. 18 shows the simulated two-dimensional optical intensity distribution in normalized representation on the laser mirror for a DFB laser diode with lateral coupling with the wave guide structure of FIG. 9 as well as the tapering of FIG. 17;

FIG. 19 shows simulated transverse far field distributions of the optical intensity of a DFB laser diode with lateral coupling with a wave guide structure according to prior art (FIG. 1) with a symmetrical LOC (FIG. 5), with an asymmetrical LOC (FIG. 9) and with a tapering of the ridge (FIG. 17);

FIG. 20 shows the simulated two-dimensional optical intensity distribution according to FIG. 18 wherein additionally a layer with large refractive index was embedded into the ridge according to FIG. 13.

5. DETAILED DESCRIPTION OF PREFERRED EMBODIMENTS

In the following, preferred embodiments of the apparatuses according to the present invention are described in more detail.

Figure 1:
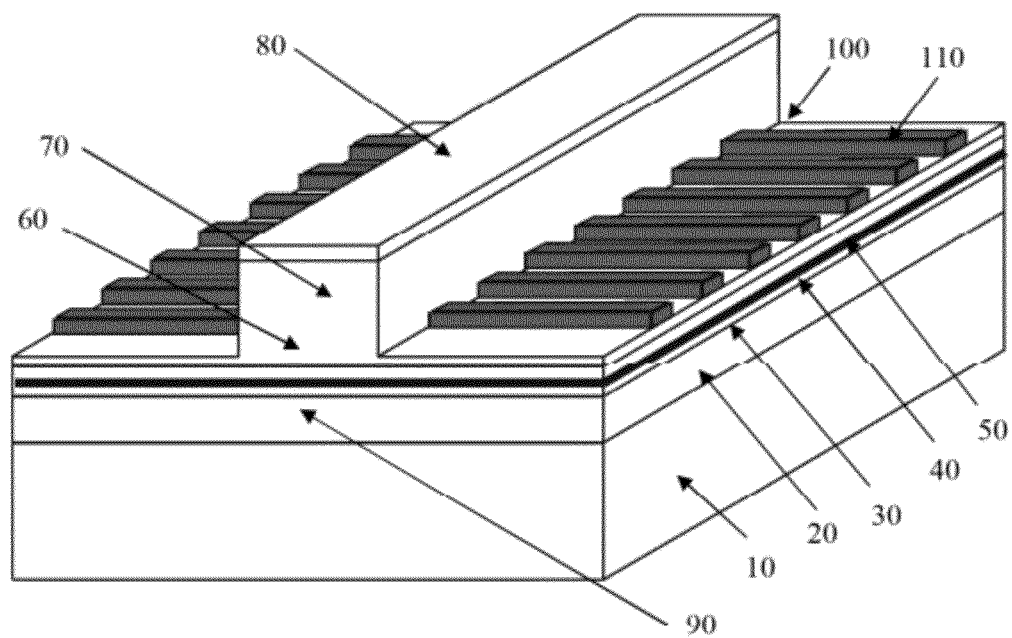

FIG. 1 schematically illustrates the most important layers that represent a DFB laser diode having a lateral coupling. The different layers are deposited on a semiconductor substrate 10 using an epitaxial process. The material system of semiconductor substrate 10 is defined by the desired wave length of the laser diode. The principles underlying the present invention that are explained in detail in the following, can be applied to all known material systems in order to manufacture laser diodes that emit light from the blue (e.g., gallium nitride substrates) to the deep infrared wave length range (e.g., based on gallium antimonide substrates). Besides substrates on the basis of III/V compound semiconductors, the disclosed principles can also be applied to DFB laser diodes with lateral coupling that are based on II/VI semiconductor substrates or other suitable substrates. The following description explains the principles underlying the present invention for DFB laser diodes with lateral coupling of the material system GaAs/Al$_x$Ga$_{(1-x)}$As (gallium arsenide/aluminum gallium arsenide).

Initially, a thick (d≈1 μm) lower cladding layer 20 (cf. FIG. 3) is deposited on substrate 10. This layer is usually highly doped in order to achieve a good electrical conductivity and comprises a large fraction of aluminum (x≈0.3) in order to provide a low refractive index. For the sake of simplicity it is also possible to do without a lower cladding layer 20. In this case, the semiconductor substrate 10 takes the function of the lower cladding layer 20.

The lower cladding layer 20 is followed by the lower wave guide layer 30 that has according to prior art a thickness for DFB laser diodes having a lateral coupling in the range of 200 nm. The fraction of aluminum of the lower wave guide layer 30 is between that of the lower cladding layer 20 and that of the active layer 40. Thereby, the refractive index has a numerical value that is in between of the lower value of the lower cladding layer 20 and the high value of the active layer 40.

Active layer 40 is the layer in which at least a partial population inversion is possible. This state results in a very big spontaneous photon emission rate in that area of the amplification bandwidth of the semiconductor material in which population inversion prevails. The photons that are created by spontaneous emission and that are essentially emitted in longitudinal direction form, as a consequence of the reflection on the laser mirrors by stimulated emission, the coherent optical intensity distribution of several modes of the laser cavity which are in the maximum of the amplification bandwidth. For DFB laser diodes having a lateral coupling, the modulation of the net gain, i.e., the material amplification reduced by the internal absorption, results in the selection of a single longitudinal natural mode of the laser cavity due to the frequency selective absorption of photons on the periodic surface structure.

The active layer can be built as a thin bulk layer (d≈0.2 µm) with no or with a much reduced aluminum fraction (x≤0.05). In modern DFB laser diodes with lateral coupling, the active layer comprises a very fine additional structure in the form of one or more quantum wells or one or a plurality of quantum dots. For the medium infrared range (λ≥4 µm), indium phosphide (InP) quantum cascade lasers may be used, which have an active layer that is comprised of multiple thin InAlAs/InGaAs periods. Furthermore, quantum cascade lasers can be based on gallium arsenide or gallium antimonide basis.

The active layer 40 of the GaAs/Al$_x$Ga$_{(1-x)}$ DFB laser diode with lateral coupling that is explained in detail in the following, comprises two quantum wells.

According to the prior art regarding DFB laser diodes having a lateral coupling, the upper wave guide layer 50 essentially has the same thickness and comprises the same aluminum fraction as the lower wave guide layer 30. While the lower wave guide layer 30 may be doped with elements that release electrons (n-doped) the upper wave guide layer 50 may be doped with elements that can collect electrons (p-doped). The aluminum fraction of the lower 30 and the upper wave guide layer 50 may be constant over the thickness of the layers. However, it is also possible that the aluminum fraction of wave guide layers 30, 50 is tapered into the direction of active layer 40. The progression of the function of this tapering may be chosen linearly or such that it has a GRIN-SCH (graded index separate confinement heterostructure) structure or it may fit any arbitrary function.

Analog to the lower cladding layer 20, the upper wave guide layer 50 is followed by upper cladding layer 60. While the lower cladding layer 20 is usually n-doped, the upper cladding layer 60 is usually p-doped. The thickness, the aluminum fraction and the amount of doping of the upper 60 and the lower cladding layer 20 are comparable.

With the deposition of a thin, very high doped GaAs contact layer 80, the epitaxial process for the manufacturing of the DFB laser diodes having a lateral coupling is finished. The semiconductor materials for the manufacturing of the DFB laser diodes with lateral coupling are thus produced in a single epitaxial process.

As illustrated in FIG. 1, after the epitaxial process is finished, the upper cladding layer 60 between the laser mirrors 90, 100 is removed outside of the ridge in a single etching step besides a small residual thickness. The remaining central portion of the upper cladding layer 60 forms the ridge 70.

As already explained above, in order to select a single natural mode from the spectrum of the Fabry-Pérot laser cavity, a periodic surface structure 110 is applied onto the remaining upper cladding layer 60 and next to the ridge 70. If required, it is possible to apply a passivation layer (not shown in FIG. 1) between the upper cladding layer 60 and periodic surface structure 110. The periodic surface structure 110 can be arranged on one side of the ridge 70 or on both sides of the ridge as shown in FIG. 1. The periodic surface structure 110 can be made as a grating structure in the form of stripes and the stripes may extend perpendicular to ridge 70. The stripes of the periodic surface structure 110 comprise a material that absorbs laser radiation, preferably a metal. Due to the geometry of the stripes and the composition of the material of the periodic surface structure 110, the amount of absorption of the laser radiation can be adjusted.

Periodic surface structure 110 may extend along a part of the full length of ridge 70. Alternatively, the periodic surface structure 110 may extend along the full length of the ridge 70. In a further alternative embodiment, the periodic surface structure and the active layer can be arranged in longitudinal direction but spatially separated from each other.

The active layer 40 comprises a higher refractive index than the lower 30 and the upper wave guide layer 50. Further, the refractive index of wave guide layers 30, 50 is larger than the refractive index of cladding layers 20, 60. This distribution of the refractive indices results in a guiding of the photons within the layer stack 20 to 60.

Figure 2:
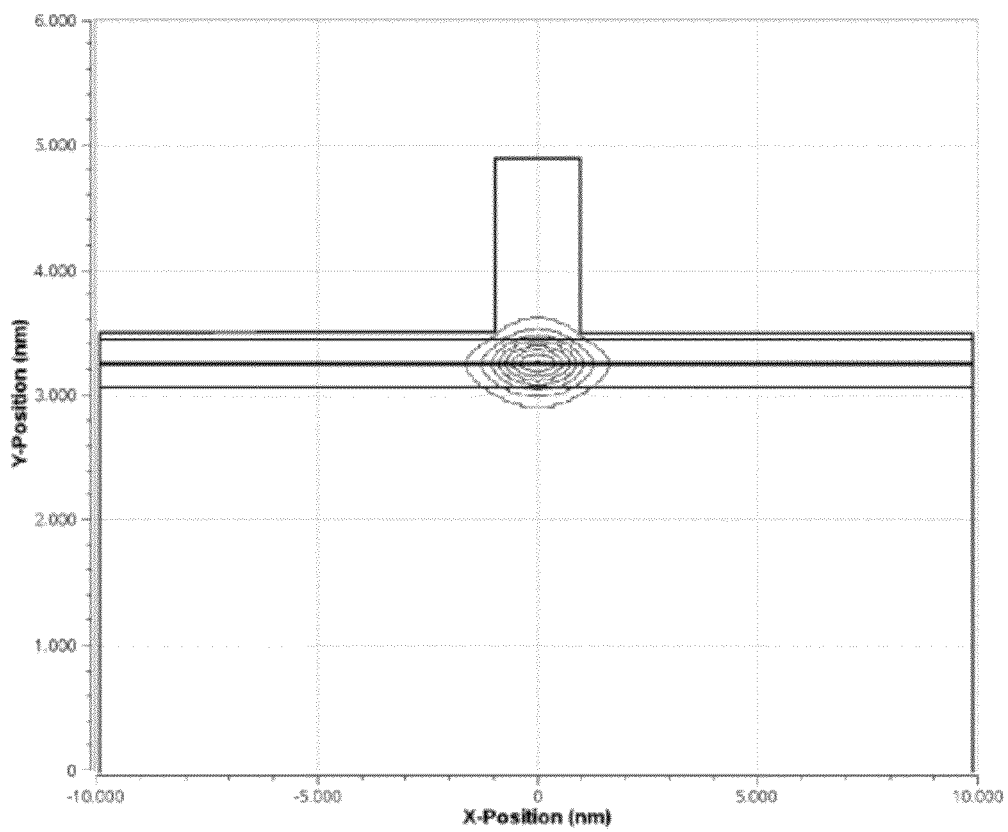
FIG. 2 shows a simulated two-dimensional optical intensity distribution in a normalized representation in the plane of a laser mirror for a DFB laser diode having a lateral coupling with a wave guide structure according to prior art.

FIG. 2 shows a two-dimensional cut in the lateral and transverse plane of the optical intensity distribution on one of the laser mirrors 90, 100 that follows for a DFB laser diode having a lateral coupling and a wave guide layer structure according to prior art. Therein, the intensity distribution is normalized such that the maximum of the photon density distribution has a value of 1. The concentric curves around the point of maximum intensity show the positions of constant photon density. The density of the optical intensity of the outermost curve corresponds to still 12.5% of the maximum value. The optical intensity between the maximum in the center and the outermost curve in FIG. 2 varies linearly. This simulation was, as all of the following simulation results, achieved with a pseudo-vectorial two-dimensional mode solver.

For the GaAs/Al$_x$Ga$_{(1-x)}$As DFB laser diode with lateral coupling as described herein, the vector of the emitted electromagnetic field shows in lateral direction, i.e., the radiation is TE polarized (transverse electrical). The principles according to the present invention could also be applied to laser diodes that emit TM polarized (transverse magnetic) light that could be created for instance by semiconductor lasers with strained quantum wells or by a quantum cascade laser.

Figure 3:
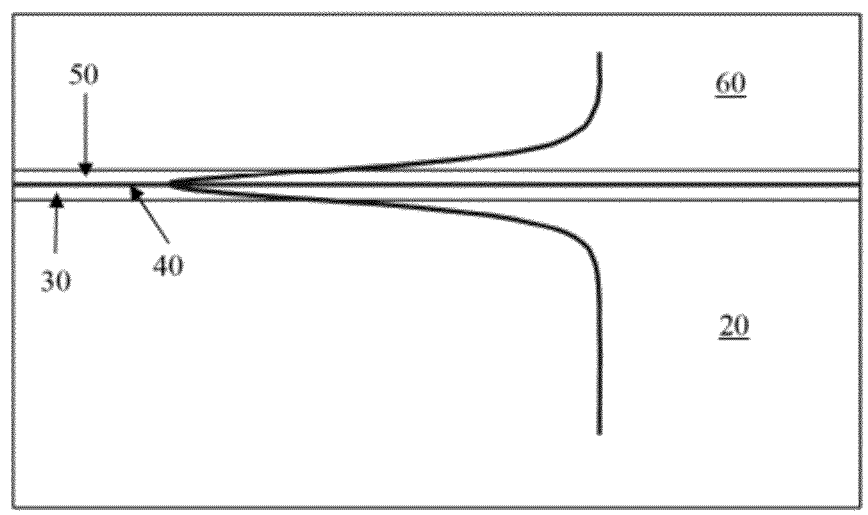
FIG. 3 shows a vertical cut of the optical intensity distribution of FIG. 2 in the maximum of the photon density distribution.

FIG. 3 shows a one-dimensional cut in transverse direction at the maximum of the optical intensity distribution of FIG. 2. As can be seen from FIG. 2 and is to be expected for the symmetrical wave guide structure of FIG. 1, the transverse intensity distribution is symmetric with respect to the thin active layer 40. The intensity maximum of the laser mode is within the active layer 40 and steeply decreases in the lower 30 and the upper wave guide layer 50, whereby the major portion of the intensity is guided in a wave guide area in the layers 20, 30 and 40. However, the lower 20 and the upper layer 60 and the ridge 70 guide significant tails of the photon distribution, respectively.

The very high optical power density in the peak of the distribution represents an enormous load on the laser mirrors 90, 100. Even if the laser mirrors 90, 100 are protected by a dielectrical coating; the optical power density limits the maximum power that can be coupled out via laser mirrors 90, 100 from the laser cavity.

A quantitative measure that characterizes the distribution of the transverse electrical field is the effective mode area $A_{\mathit{eff}}$. For a laser mode that has a transverse electrical field distribution according to a Gaussian-function, i.e., $E_T(r) \propto \exp(-r^2/w_0^2)$, the relation between $w_0$ and the effective mode area $A_{\mathit{eff}}$ follows as: $A_{\mathit{eff}} = \pi \cdot w_0^2$. For the intensity distribution of a GaAs DFB laser diode with lateral coupling according to prior art as illustrated in FIGS. 2 and 3, results in an effective mode area $A_{\mathit{eff}} = 0.78 \, \mu m^2$.

Figure 4:
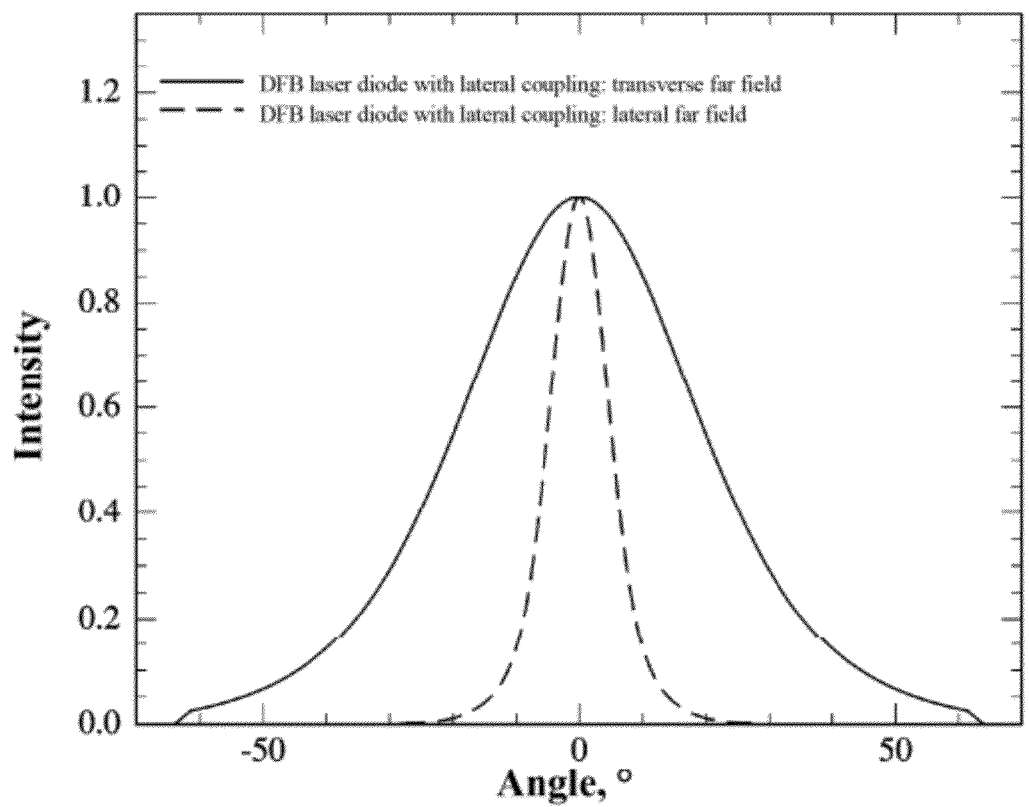
FIG. 4 shows lateral and transverse far field distributions of the optical intensity of the DFB laser diode having a lateral coupling of the FIGS. 1-3.

FIG. 4 illustrates the far field distributions in lateral and transverse direction of the two dimensional optical intensity distribution of FIG. 2. As can be seen from FIG. 2, the photon density distribution in lateral direction is much more extended than a transverse direction. Since the emission of the laser mode from laser mirrors 90, 100 essentially occurs diffraction limited, the asymmetrical optical intensity distribution on the laser mirrors 90, 100 is reflected by the strongly different divergence angles of the emitted light in lateral and transverse direction. In order to focus this radiation profile, complex and multipart optics are required. Nevertheless, for elements with rotational symmetry such as optical fibers, the coupling efficiency is limited due to the tails of the intensity distribution at very large angles.

Figure 5:
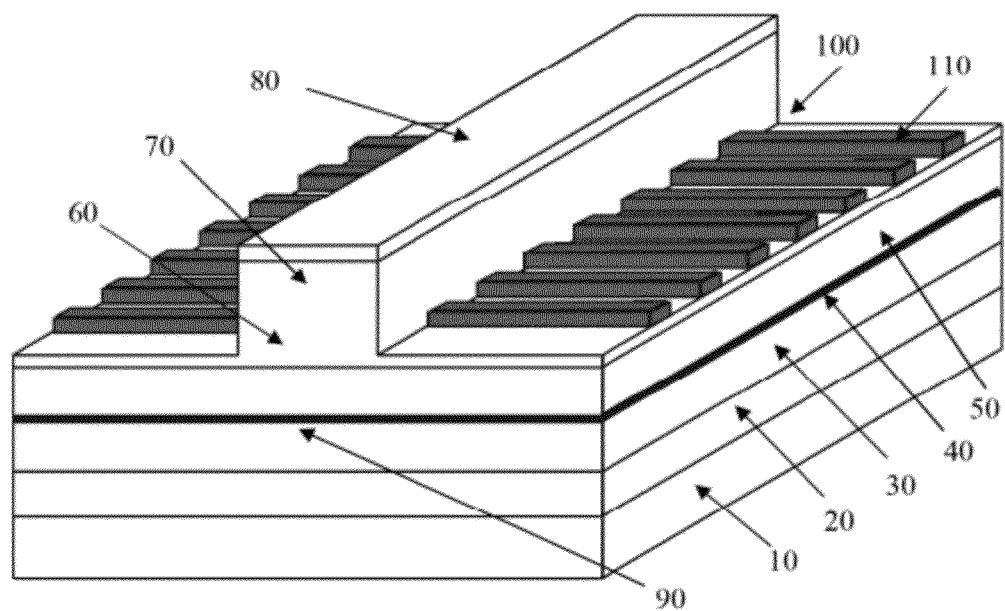
FIG. 5 shows a schematic drawing of the most important layers of a DFB laser structure having a lateral coupling wherein the lower and the upper wave guide layers comprise a large thickness, respectively, and thus are built in the type of a large optical cavity (LOC)

FIG. 5 shows the layer stack of FIG. 1 wherein the thickness of the lower 30 and the upper wave guide layer 50 has been increased from approximately 0.2 μm to approximately 1.0 μm, respectively, such that both wave guide layers 30, 50 build a so-called LOC (large optical cavity). In more detail, it is a symmetrical LOC since both wave guide layers 30, 50 comprise the same thickness. The remaining assembly of the DFB laser diode with lateral coupling was not changed with respect to FIG. 1. As already explained above, the aluminum fraction of the wave guide layers 30, 50 of the symmetric LOC may be constant over the thickness of the layer or as also explained above, the aluminum fraction may be reduced into the direction of the active layer 40.

FIG. 6 again shows a two dimensional cut of the simulated optical intensity distribution in the plane of a laser mirror 90, 100 that can be measured for a DFB laser diode with lateral coupling and a wave guide layer structure that has the shape of a symmetrical LOC. By comparing FIGS. 2 and 6, it can directly be seen that the asymmetry of the photon density distribution in lateral and transverse direction is clearly reduced by the symmetrical LOC. This is essentially a result of the explicit widening of the laser mode in transverse direction. The effective mode area of 8.63 $\mu m^2$ which has been considerably increased with respect to prior art also reflects this relationship.

Figure 6:
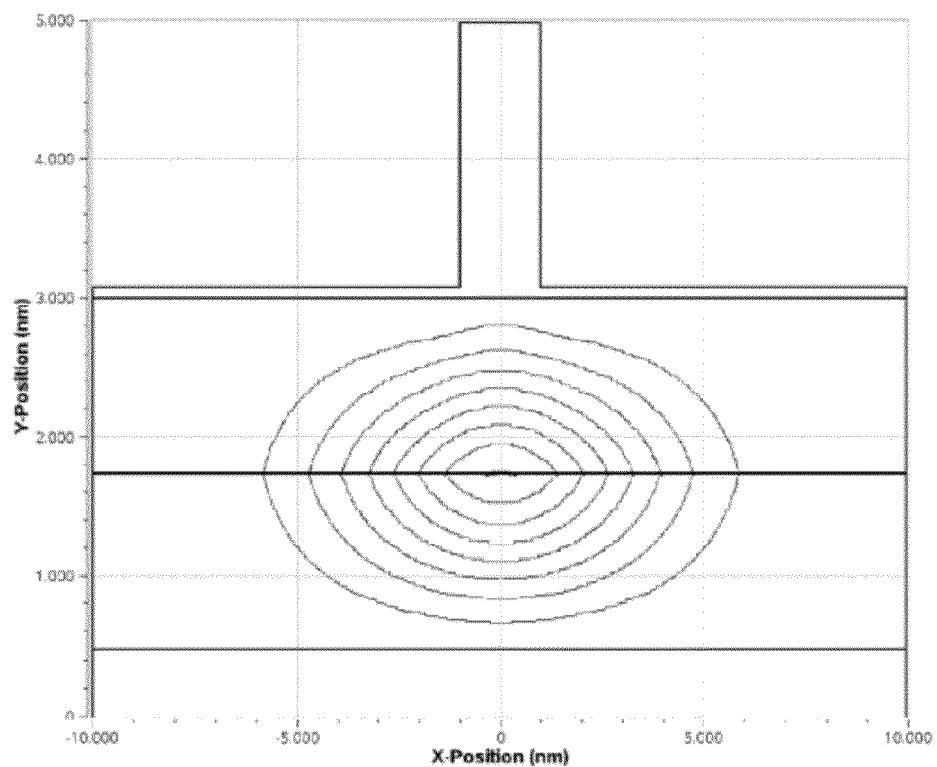
FIG. 6 shows the simulated two-dimensional optical intensity distribution in normalized representation in the plane of a laser mirror for a DFB laser diode having a lateral coupling with the wave guide structure according to FIG. 5.
Figure 7:
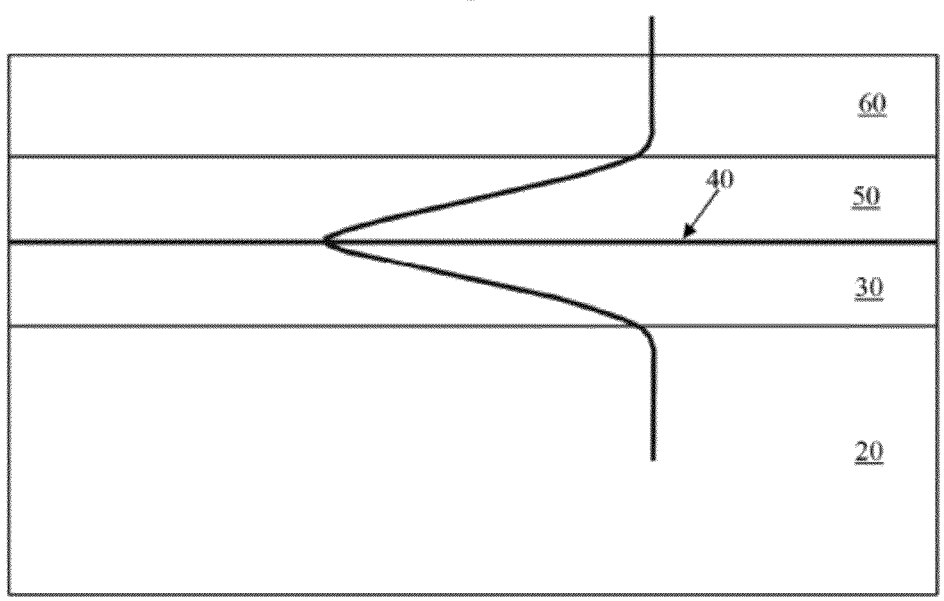
FIG. 7 shows a vertical cut of the optical intensity distribution according to FIG. 6 at the maximum of the photon density distribution.

This conclusion is also supported by FIG. 7. It shows a one dimensional cut in transverse direction at the maximum of the optical intensity distribution of FIG. 6. FIG. 7 essentially gives two results: As compared to FIG. 3, the maximum of the optical power density is lower and $A_{\mathit{eff}}$ has been increased from 0.78 $\mu m^2$ to 8.63 $\mu m^2$. Furthermore, the laser mode is nearly completely guided within wave guide layers 30, 50.

Due to the reduction of the peak of the maximum optical power density by a factor of more than 10 between the DFB laser diode having a lateral coupling according to prior art and with a symmetrical LOC, the load on laser mirrors 90, 100 is accordingly reduced. Thus, at a given maximum optical power density the light output that can be coupled out from the laser cavity may be increased without starting the aging processes of laser mirrors 90, 100 which would result in a limitation of the lifetime of the DFB laser diode having a lateral coupling due to COD.

Figure 8:
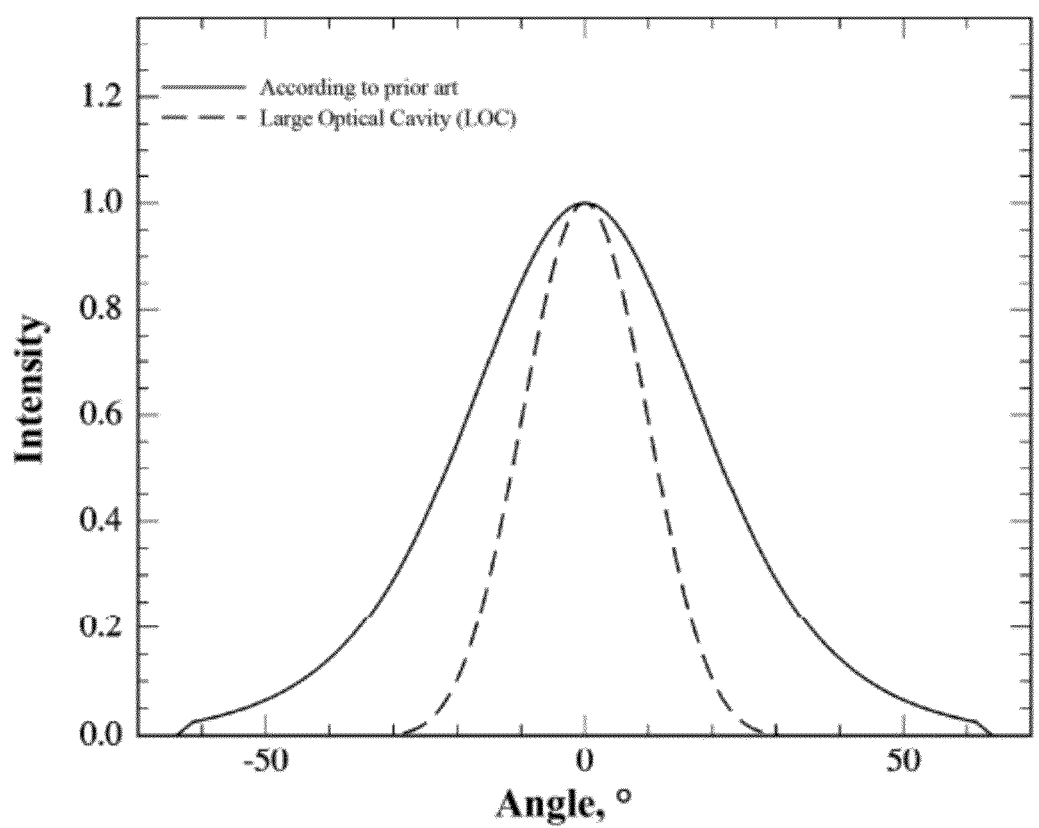
FIG. 8 shows simulated transverse far field distributions of the optical intensity of a DFB laser diode having a lateral coupling with a wave guide structure according to prior art and with symmetrical thick wave guide layers below and above the active layer (symmetrical LOC)

FIG. 8 compares the far field distributions in transverse direction of the optical intensity distribution of FIGS. 3 and 7 next to each other. The full width at half maximum of the divergence angle has been cut in half as compared to prior art. Thereby also the asymmetry of the radiation distribution in lateral and in transverse direction in the far field of the DFB laser diode having a lateral coupling has been cut in half. This simplifies the coupling of the radiation profile, e.g., into optical fibers and at the same time increases the coupling efficiency since no portions of the radiation are present at very large divergence angles.

As can be seen from FIGS. 6 and 7 the symmetrical LOC structure of FIG. 5 has the serious disadvantage that due to the thick upper wave guide layer 50 the coupling of the laser mode to the periodic grating structure 110 is drastically reduced. This means that the suppression of the unwanted natural modes of the laser cavity which are within the amplification bandwidth of the material of the active layer 40 is clearly reduced, or completely lost, respectively. In this case, the DFB laser diode with lateral coupling does no longer work as DFB laser but as Fabry-Pérot laser diode that emits light at several normal oscillations of different wavelength.

This problem can be solved by making the upper wave guide layer 50 very thin. Thereby, the thickness of the upper wave guide layer may also be made smaller than known from prior art (d≤0.1 μm). The lower wave guide layer 30, however, maintains its thickness (d≈1.0 μm) as can be seen in FIG. 5. Alternatively, the thickness of the lower wave guide layer 30 may be broadened such that it essentially comprises the thickness of the full symmetrical LOC of FIG. 5 (d≈2.5 μm). The thickness of the lower wave guide layer 30 may also take all other values between both alternatives. The aluminum fraction and thus the refractive index again may be constant or vary over the layer thickness as already explained above.

FIG. 9 shows the layer stack of FIG. 5 wherein the thickness of the wave guide layers 30, 50 has been reduced from approximately 1.0 μm to approximately 25 nm for the upper wave guide layer 50 and that of the lower wave guide layer 30 has been increased from approximately 1.0 μm to approximately 2.5 μm such that they form a highly asymmetrical LOC. The DFB laser diode having a lateral coupling of FIG. 9 comprises no further modifications as compared to FIG. 5.

FIG. 10 again shows a two dimensional cut of the simulated optical intensity distribution in the plane of a laser mirror 90, 100 that is formed for a DFB laser diode having a lateral coupling and a wave guide layer structure in the form of an asymmetrical LOC. The asymmetrical LOC results in an asymmetric transverse optical intensity distribution according to active layer 40. The effective mode area of this structure is 0.63 $\mu m^2$ and therefore lower than that of the DFB laser diodes according to prior art ($A_{\mathit{eff}} = 0.78 \, \mu m^2$). This means that the reduction of the thickness of the upper wave guide layer 50 beyond the thickness known from the prior art in a chosen asymmetrical LOC cannot be compensated by further increasing the thickness of the lower wave guide layer 30 beyond the state of a symmetrical LOC in terms of the effective mode area. The comparison of FIGS. 6 and 10 clearly shows that the contribution of the optical intensity that is guided in the range of the ridge for the asymmetrical LOC is much larger than for the symmetrical LOC of FIG. 6. The above described problem of the too low coupling of the laser radiation to the periodic grating structure 110 largely avoids an asymmetrical LOC.

Figure 11:
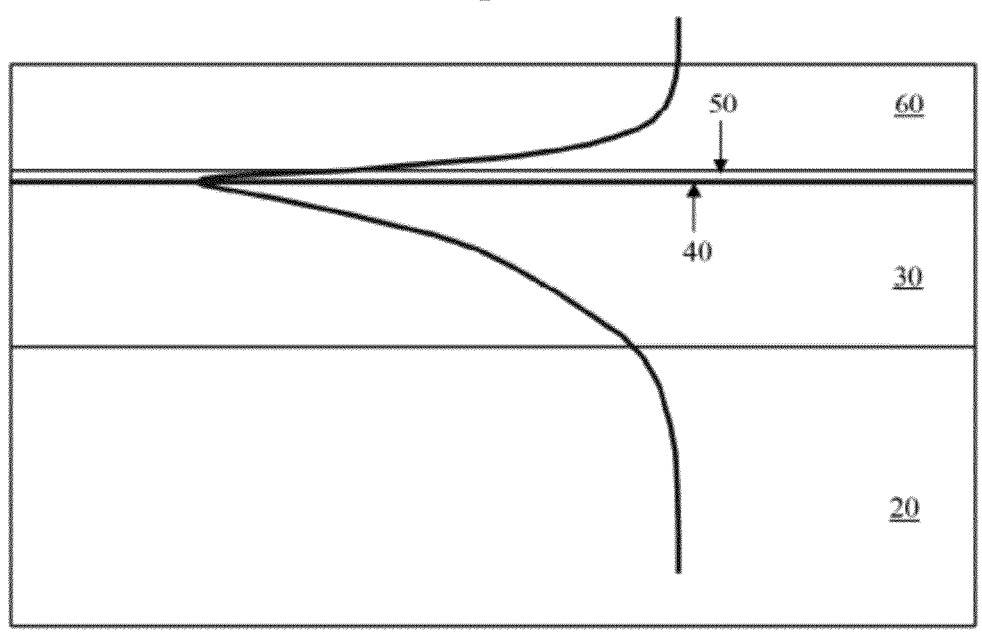
FIG. 11 represents a vertical cut of the optical intensity distribution according to FIG. 10 at the maximum of the photon density distribution.

FIG. 11 represents a cut in transverse direction at the maximum of the optical intensity. The highest value of the optical power density is still located in the active layer 40. The transverse distribution, however, is clearly asymmetric and the main portion of the optical radiation is guided in the lower wave guide layer 30. The radiation portion in the lower cladding layer 20 is low. Since the upper wave guide layer 50 is extremely thin it comprises an extremely large gradient of the photon density. The upper cladding layer 60 or the ridge 70 guides a tail of the intensity distribution that carries a significant part of the radiation. As already mentioned, the asymmetric LOC again reduces the effective mode area ($A_{eff}=0.63$ $\mu m^2$) as compared to DFB laser diodes having a lateral coupling according to the prior art ($A_{eff}=0.78$ $\mu m^2$).

Figure 12:
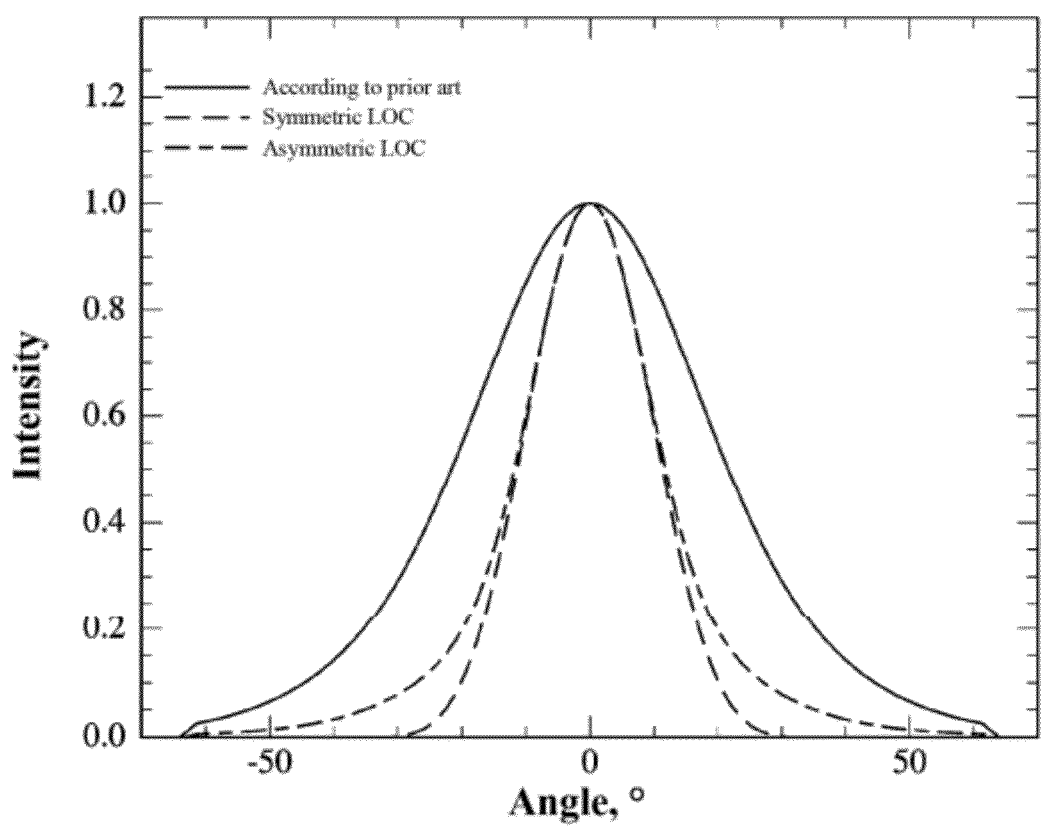
FIG. 12 shows simulated transverse far field distributions of the optical intensity of a DFB laser diode having a lateral coupling with a wave guide stricture according to prior art (FIG. 1) with a symmetrical LOC (FIG. 5) and with an asymmetrical LOC (FIG. 9)

FIG. 12 compares the far field distributions in transverse direction of the optical intensity distribution of FIGS. 3, 7 and 11 next to each other. The full width at half maximum of the divergence angle of the symmetric and the strongly asymmetric LOC are nearly identical since both distributions show the same characteristics for divergence angles above 50%. However, the intensity distribution of the laser mode that is guided in the asymmetric LOC shows broader tails than the intensity distribution of the symmetric LOC.

Figure 10:
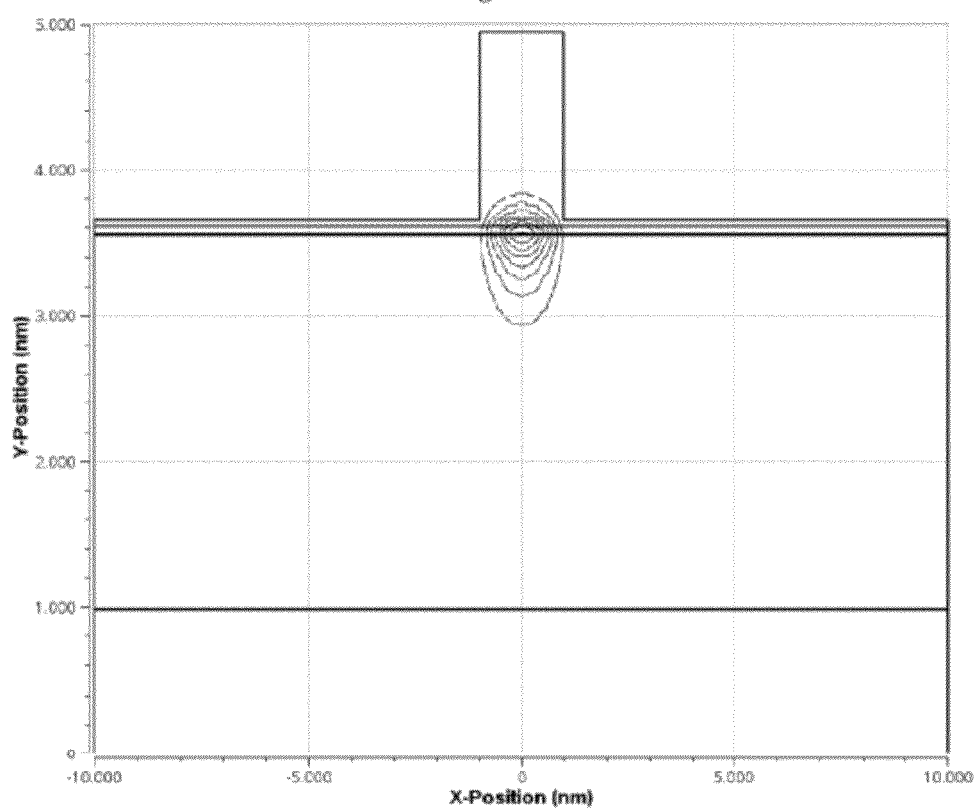
FIG. 10 shows a simulated two-dimensional optical intensity distribution in normalized representation in the plane of a laser mirror for a DFB laser diode with lateral coupling with the wave guide structure of FIG. 9.

As can be seen from FIGS. 10 and 11, the fraction of the laser mode that is guided in the upper cladding layer clearly increases as compared to the symmetric LOC which is due to the asymmetric LOC. This allows for a certain overlapping of the laser mode with the periodic surface structure 110 which is necessary for the functioning of the lateral coupling. An additional possibility for influencing the coupling strength of the laser mode to the periodic surface structure 110 poses the formation of a thin layer with high refractive index 120 in the ridge 70 and above the periodic surface structure 110. Such a layer is shown in FIG. 13. In other respects FIG. 13 is identical to FIG. 9 which shows an asymmetric LOC.

FIG. 14 shows a two dimensional cut of the simulated optical intensity distribution in the plane of a laser mirror 90, 100 as shown in FIG. 10, wherein an additional layer with high refractive index 120 has been implemented in the ridge 70 as shown in FIG. 9. Due to this layer 120, the optical intensity distribution is slightly displaced from the lower wave guide layer 30 into the upper cladding layer 60. As can be seen from the comparison of FIGS. 10 and 14, the layer with high refractive index 120 still reduces the already small effective mode area of the asymmetric LOC ($A_{eff}=0.63$ $\mu m^2$). The effective mode area of the asymmetric LOC of FIG. 14 comprising a layer having a high refractive index 120 in the upper layer 60 above the periodic surface structure 110 (FIG. 13) is 0.43 $\mu m^2$.

As can be seen from the one dimensional cut in transverse intensity density of FIG. 15, the layer with the high refractive index 120 results in a small increase of the optical power density in the range of the ridge 70. Moreover, a small plateau with nearly constant optical power density is formed in the area of the layer with high refractive index 120. This improves the coupling of the laser mode to the periodic surface structure 110 without influencing the remaining optical intensity distribution significantly. Thereby, it is in particular possible to improve the coupling constant of the periodic surface structure for the asymmetric LOC. Applying a thin layer with high refractive index 120 in the ridge 70 is, however, not limited to an asymmetric LOC structure. This layer can also be applied to DFB laser diodes having a lateral coupling according to prior art and to such ones having a symmetric LOC.

The layer with high refractive index 120 could overcome or at least clearly reduce a further problem that could occur at the production of DFB laser diodes. When removing the upper cladding layer 60 outside of the ridge it may happen that, due to fluctuations in the etching process that is used for removing the upper cover layer 60, different residual thicknesses of the upper cladding layer 60 occur outside of the ridge 70. As shown in FIGS. 3 and 11, the tails of the optical intensity distribution strongly change in this area. Such layer with high refractive index 120 can be used to compensate the variations of the coupling constant to the periodic surface structure 110 at least in part.

As can be seen from FIG. 12, the asymmetric LOC of the FIGS. 9 and 13 comprises larger intensity fractions than the symmetric LOC for large divergence angles. Compared to the transverse far fields of common structures known from prior art, the far field is significantly less divergent such that a simpler coupling into optics devices becomes possible.

A problem poses the still very large maximum optical power densities in the peaks of the intensity distributions shown in FIGS. 3, 7, 11 and 15, except for the symmetric LOC structure (FIG. 5). A quantitative reason for this interrelation is the effective mode areas of the wave guide structures that have been discussed so far. FIGS. 16 and 17 show possibilities how this problem can be solved.

FIG. 16 shows a part of the asymmetric LOC structure of FIG. 9 in which the ridge 70 is linearly tapered into the direction of a laser mirror 90, 100. In FIG. 17 this tapering of the width of ridge 70 follows an exponential function. Both of these figures show merely examples of a tapering of the ridge 70. Ridge 70 may be tapered according to any arbitrary non-linear function or, for instance, stepwise. Moreover, the width of ridge 70 may be tapered only on one side. Therefore, instead of the symmetrical tapering with respect to the longitudinal axis of the ridge as shown in FIGS. 16 and 17, it is also possible to build an asymmetric tapering on both sides of ridge 70, wherein the tapering on both sides may follow the same or different functional dependencies.

The tapering of the ridge may be into the direction of a laser mirror 90 or 100 or in direction of both laser mirrors 90 and 100. Thereby, the tapering may be carried out equally or differently in the direction of both laser mirrors 90, 100.

The metallization of contact layer 80 could extend over the full range in which the width of ridge 70 changes. Alternatively, the metallization of contact layer 80 could extend over a part of the range wherein the width of ridge 70 changes; or the metallization of the contact layer 80 does not extend over the range wherein the width of ridge 70 is changed. It is further conceivable that the electro-plating of contact layer 80 over the width of ridge 70 is interrupted at the position where the tapering of the width of the ridge 70 begins.

FIGS. 16 and 17 do not comprise a periodic surface structure 110 in the tapering area. The periodic surface structure 110, however, can extend into the range of the tapering. Thereby, its periodicity may be adapted to the respective width of the ridge 70. Alternatively, the period of the range wherein the width of the ridge is constant may be sustained into the tapering area.

Alternatively to a reduction of the width of ridge 70 as shown in FIGS. 15 and 16 it is possible to reduce the height of the ridge 70 in order to achieve the same result. Furthermore, a combination of the tapering of the width and a reduction of the height of the ridge may be advantageously used.

The tapering of ridge 70 was discussed in the context of an asymmetrical LOC. However, a LOC is not necessary for tapering the width of the ridge. This principle may also be applied to a DFB laser diode according to prior art.

FIG. 18 shows a two dimensional cut in the simulated optical intensity distribution in the plane of a laser mirror 90, 100 which follows from a DFB laser diode having a lateral coupling with an asymmetric LOC and a tapering of the ridge 70 according to one of the FIG. 16 or 17. The width of ridge 70 was reduced from approximately 2.0 µm to approximately 0.3 µm on the laser mirror 90, 100. In general, a ridge 70 is constructed such that its width corresponds to several wave lengths of the emitted radiation in the semiconductor material. At the end of the tapering, the width of ridge 70 is reduced to approximately the wavelength of the laser light in the laser cavity.

The laser mode escapes the contraction within the ridge 70 downwardly and essentially occupies the whole lower wave guide layer 30 on the laser mirror. The effective mode area has been increased by the tapering of ridge 70 by approximately a factor of 17 to $A_{eff}$=10.74 µm$^2$ as compared to the asymmetric LOC. In particular, the effective mode area of the tapered asymmetric LOC is larger than the effective mode area of the symmetric LOC ($A_{eff}$=8.63 µm$^2$). As compared to a DFB laser diode with lateral coupling according to prior art ($A_{eff}$=0.78 µm$^2$), a DFB laser diode with lateral coupling with asymmetric LOC and a tapering comprises an effective mode area that is approximately fourteen times larger. Due to the dramatic expansion of the laser mode at the laser mirror 90, the maximum optical power density is reduced by approximately one order of magnitude. This allows a corresponding increase of the light output that may be coupled out from the laser mirror 90, 100.

FIG. 19 shows the far field distributions in transverse direction of the optical intensity distribution of a DFB laser diode with lateral coupling according to prior art (FIG. 1) with symmetric LOC (FIG. 5), with asymmetric LOC (FIG. 9) and with asymmetric LOC and an additional tapering of ridge 70 (FIGS. 16 and 17) compared to each other. The full width at half maximum of the divergence angle of the asymmetric LOC with tapering is again lower than the divergence angle of symmetric LOC. Thus, the divergence angles of the lateral and vertical far field distributions of the asymmetric LOC with additional tapering have been essentially aligned. Therefore, the light output which can be coupled out and which has been significantly increased due to the tapering of the ridge 70 may be coupled into rotationally symmetric optical elements, such as optical fibers, without large effort and with high efficiency.

As already explained with respect to FIGS. 14 and 15, a thin layer with high refractive index 120 in ridge 70 above the periodic grating structure 110 allows to increase the coupling of the laser mode to the periodic structure 110 and thereby to increase the suppression of undesired natural modes. FIG. 20 shows the two dimensional cut of the simulated optical intensity distribution in the plane of a laser mirror 90, 100 of FIG. 18 wherein additionally a layer with high refractive index 120 has been implemented to ridge 70. From a comparison of FIGS. 18 and 20 it can be seen that this layer 120 results in a certain increase of the optical intensity in the range of ridge 70 and on both sides of it. The impairment of the intensity distribution on the laser mirror 90, 100 when compared to an asymmetric LOC with tapering and expressed in terms of the reduction of the mode area shows a reduction of less than 8% to $A_{eff}$=9.96 µm$^2$. Thereby, the combination of an asymmetric LOC with a tapering of ridge 70 and a layer of high refractive index 120 simultaneously achieves a sufficient coupling efficiency between the laser mode and the periodic surface structure 110 and a large effective mode area. A large value of the last mentioned quantity is an essential requirement for large light outputs that may be coupled out for one of the laser mirrors 90, 100.

The shift and broadening of the laser mode only occurs in the range where the ridge 70 is tapered. As can be seen from FIGS. 2 and 3, 10 and 11, as well as 15 and 16, the intensity distributions achieved in the center of the laser cavity have an intensity maximum in the range of the active layer 40. As can be seen from the following Table 1, the effective mode area of the chosen asymmetric LOC and the asymmetric LOC with a layer of a refractive index 120 is smaller than that of a DFB laser diode having a lateral coupling according to prior art. Therefore, the confinement factor of the laser mode in the amplification area of the active layer 40 in the center of the laser cavity is not noticeably changed. Thereby, none of the principles according to the present invention significantly change the important parameters of DFB laser diodes with lateral coupling.

The following table summarizes the effective mode areas of the discussed principles of the present invention.

TABLE 1

Comparison of the effective mode area of different principles according to the present invention

| Structure | $A_{eff}$ [µm$^2$] | Reference |
| --- | --- | --- |
| Prior art | 0.78 | FIG. 2 |
| Symmetric LOC | 8.63 | FIG. 6 |
| Asymmetric LOC | 0.63 | FIG. 10 |
| Asymmetric LOC + layer 120 | 0.43 | FIG. 14 |
| Asymmetric LOC + tapering | 10.74 | FIG. 18 |
| Asymmetric LOC + layer 120 + tapering | 9.96 | FIG. 20 |

In the following table, an exemplary layer stack of a GaAs/Al$_x$Ga$_{(1-x)}$As DFB laser diode having a lateral coupling is shown that realizes both principles of the invention of an asymmetric LOC and a layer with high refractive index 120 in an epitaxial process.

TABLE 2

Layer stack of a DFB laser diode having a lateral coupling with asymmetric LOC and a layer with high refractive index

| Function | Thickness [nm] | Material | Al-fraction [%] | Doping [cm$^{-3}$] | Type |
| --- | --- | --- | --- | --- | --- |
| Contact layer 80 | 150 | GaAs | — | $1 \cdot 10^{20} - 1 \cdot 10^{19}$ | P |
| Upper cladding | 100 | Al$_x$Ga$_{(1-x)}$As | x = 0.34 | $1 \cdot 10^{19} - 5 \cdot 10^{18}$ | P |
| layer 60 | 1250 | Al$_x$Ga$_{(1-x)}$As | x = 0.34 | $5 \cdot 10^{18} - 1 \cdot 10^{17}$ | P |
|  | 100 | Al$_x$Ga$_{(1-x)}$As | x = 0.34 | $1 \cdot 10^{17}$ | P |
|  | 25 | Al$_x$Ga$_{(1-x)}$As | $0.34 \geq x \geq 0$ | $1 \cdot 10^{17}$ | P |
| Layer 120 | 50 | GaAs | — | $1 \cdot 10^{17}$ | P |
| Upper cladding | 25 | Al$_x$Ga$_{(1-x)}$As | $0 \leq x \leq 0.34$ | $1 \cdot 10^{17}$ | P |

TABLE 2-continued

Layer stack of a DFB laser diode having a lateral coupling with asymmetric LOC and a layer with high refractive index

| Function | Thickness [nm] | Material | Al-fraction [%] | Doping [cm$^{-3}$] | Type |
|---|---|---|---|---|---|
| layer 60 | 250 | Al$_x$Ga$_{(1-x)}$As | x = 0.34 | $1 \cdot 10^{17}$ | P |
| Upper wave guide 50 | 25 | Al$_x$Ga$_{(1-x)}$As | 0.34 ≥ x ≥ 0 | intrinsic | — |
| Active layer 40 | 10 | GaAs | — | intrinsic | — |
| | 8 | Quantum well | | | |
| | 10 | GaAs | — | intrinsic | — |
| | 8 | Quantum well | | | |
| | 10 | GaAs | — | intrinsic | — |
| Lower wave guide 30 | 25 | Al$_x$Ga$_{(1-x)}$As | 0 ≤ x ≤ 0.24 | intrinsic | — |
| | 25 | Al$_x$Ga$_{(1-x)}$As | x = 0.24 | $1 \cdot 10^{17}$ | N |
| | 2000 | Al$_x$Ga$_{(1-x)}$As | x = 0.24 | $1 \cdot 10^{17} - 5 \cdot 10^{17}$ | N |
| Lower cladding layer 20 | 1000 | Al$_x$Ga$_{(1-x)}$As | x = 0.35 | $1 \cdot 10^{18}$ | N |
| Substrate 10 | | | | | |

The invention claimed is:

1. A distributed feedback (DFB) laser diode having a lateral coupling, comprising:
   at least one semiconductor substrate;
   at least one active layer that is arranged on the semiconductor substrate, wherein a cross section of the at least one ridge is tapered in the direction of at least one laser mirror, wherein a width of the at least one ridge is tapered in the direction of both laser mirrors, and wherein the tapering of the width of the at least one ridge in the direction of both laser mirrors is asymmetrical with respect to a longitudinal and/or a lateral direction;
   at least one ridge that is arranged above the active layer;
   at least one periodic surface structure that is arranged above the active layer next to the at least one ridge, wherein the periodic surface structure is applied to an upper cladding layer that remains after an etching process; and
   at least one wave guide layer that is arranged below and above the active layer, wherein a lower wave guide layer of the at least one wave guide layer comprises a thickness in the range of 1 µm to 5 µm.

2. The DFB laser diode of claim 1, wherein the lower wave guide layer comprises a thickness in the range of 1.5 µm to 3 µm.

3. The DFB laser diode of claim 1, wherein the lower wave guide layer comprises a thickness in the range of 2.0 µm to 2.5 µm.

4. The DFB laser diode of claim 1, wherein an upper wave guide layer of the at least one wave guide layer comprises a thickness in the range of 15 nm to 100 nm.

5. The DFB laser diode of claim 1, wherein an upper wave guide layer of the at least one wave guide layer comprises a thickness in the range of 20 nm to 50 nm.

6. The DFB laser diode of claim 1, wherein the difference of the refractive indices between the active layer and the at least one wave guide layer is in the range from 0.04 to 0.40.

7. The DFB laser diode of claim 1, wherein the difference of the refractive indices between the active layer and the at least one wave guide layer is in the range from 0.06 to 0.30.

8. The DFB laser diode of claim 1, wherein the difference of the refractive indices between the active layer and the at least one wave guide layer is in the range from 0.08 to 0.25.

9. The DFB laser diode of claim 1, wherein the refractive index of the at least one wave guide layer remains constant over the thickness of the layer.

10. The DFB laser diode of claim 1, wherein the refractive index of the at least one wave guide layer changes over the thickness of the layer in a linear manner.

11. The DFB laser diode of claim 1, wherein a width of the at least one ridge is linearly tapered in the direction of at least one laser mirror.

12. The DFB laser diode of claim 1, wherein a width of the at least one ridge is exponentially tapered in the direction of at least one laser mirror.

13. The DFB laser diode of claim 1, wherein the at least one ridge comprises a width in the range from 0.5 µm to 10 µm.

14. The DFB laser diode of claim 1, wherein the at least one ridge comprises a width in the range from 2 µm to 7 µm.

15. The DFB laser diode of claim 1, wherein the at least one ridge comprises a width in the range from 2 µm to 4 µm.

16. The DFB laser diode of claim 1, wherein a width of the at least one ridge on at least one laser mirror is in the range from 100 nm to 700 nm.

17. The DFB laser diode of claim 1, wherein a width of the at least one ridge on at least one laser mirror is in the range from 200 nm to 500 nm.

18. The DFB laser diode of claim 1, wherein the tapering of the width of the at least one ridge in the direction of at least one laser mirror occurs over a length in the range from 50 µm to 1000 µm.

19. The DFB laser diode of claim 1, wherein the tapering of the width of the at least one ridge in the direction of at least one laser mirror occurs over a length in the range from 100 µm to 600 µm.

20. The DFB laser diode of claim 1, wherein the tapering of the width of the at least one ridge in the direction of at least one laser mirror occurs over a length in the range from 200 µm to 400 µm.

21. The DFB laser diode of claim 1, wherein the periodic surface structure does not extend along the area where the cross-section of the at least one ridge changes.

22. The DFB laser diode of claim 1, further comprising:
   an additional layer that is arranged in the at least one ridge and which has a refractive index larger than the refractive index of the at least one ridge.

23. The DFB laser diode of claim 22, wherein the additional layer with the high refractive index is arranged above the periodic surface structure.

24. The DFB laser diode of claim 22, wherein the difference of refractive indices between the additional layer with high refractive index and the at least one ridge is in the range from 0.10 to 0.40.

25. The DFB laser diode of claim 22, wherein the difference of refractive indices between the additional layer with high refractive index and the at least one ridge is in the range from 0.15 to 0.35.

26. The DFB laser diode of claim 22, wherein the difference of refractive indices between the additional layer with high refractive index and the at least one ridge is in the range from 0.20 to 0.30.

27. The DFB laser diode of one of the claim 22, wherein the thickness of the additional layer with high refractive index is in the range ≤5% of a thickness of the at least one ridge.

* * * * *